United States Patent
Siemieniec et al.

(10) Patent No.: US 10,177,250 B2
(45) Date of Patent: Jan. 8, 2019

(54) METHOD OF MANUFACTURING A SEMICONDUCTOR DEVICE WITH A METAL-FILLED GROOVE IN A POLYSILICON GATE ELECTRODE

(71) Applicant: Infineon Technologies Austria AG, Villach (AT)

(72) Inventors: Ralf Siemieniec, Villach (AT); Oliver Blank, Villach (AT); Li Juin Yip, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 15/679,195

(22) Filed: Aug. 17, 2017

(65) Prior Publication Data
US 2018/0026130 A1    Jan. 25, 2018

Related U.S. Application Data

(60) Division of application No. 14/747,681, filed on Jun. 23, 2015, now Pat. No. 9,768,290, which is a
(Continued)

(51) Int. Cl.
*H01L 29/78* (2006.01)
*H01L 29/423* (2006.01)
(Continued)

(52) U.S. Cl.
CPC .... *H01L 29/7811* (2013.01); *H01L 21/28035* (2013.01); *H01L 21/32133* (2013.01);
(Continued)

(58) Field of Classification Search
CPC ......... H01L 21/32133; H01L 21/28035; H01L 29/7811; H01L 29/0696; H01L 29/1095;
(Continued)

(56) References Cited

U.S. PATENT DOCUMENTS 5,770,514 A    6/1998  Matsuda et al.
7,982,265 B2   7/2011  Challa et al.
(Continued)

FOREIGN PATENT DOCUMENTS

CN    102623501 A    8/2012

*Primary Examiner* — Cheung Lee
*Assistant Examiner* — Stephen C Smith
(74) *Attorney, Agent, or Firm* — Murphy, Bilak & Homiller, PLLC

(57) ABSTRACT

A method of manufacturing a semiconductor device includes: forming a trench extending into a semiconductor substrate and a polysilicon gate electrode in the trench; forming a body region of a first conductivity type in the substrate adjacent the trench and a source region of a second conductivity type adjacent the body region and the trench; forming a dielectric layer on the substrate; forming a gate metallization on the dielectric layer which covers part of the substrate and a source metallization on the dielectric layer which is electrically connected to the source region, spaced apart from the gate metallization and covering a different part of the substrate than the gate metallization; and forming a metal-filled groove in the polysilicon gate electrode which is electrically connected to the gate metallization. The metal-filled groove extends along a length of the trench underneath at least part of the source metallization.

19 Claims, 19 Drawing Sheets

Related U.S. Application Data continuation of application No. 13/673,458, filed on Nov. 9, 2012, now Pat. No. 9,105,713.

(51) Int. Cl.
| | |
|---|---|
| *H01L 29/40* | (2006.01) |
| *H01L 29/49* | (2006.01) |
| *H01L 29/06* | (2006.01) |
| *H01L 29/10* | (2006.01) |
| *H01L 21/3213* | (2006.01) |
| *H01L 21/28* | (2006.01) |
| *H01L 29/417* | (2006.01) |
| *H01L 29/66* | (2006.01) |

(52) U.S. Cl.
CPC ...... *H01L 29/0696* (2013.01); *H01L 29/1095* (2013.01); *H01L 29/404* (2013.01); *H01L 29/407* (2013.01); *H01L 29/41741* (2013.01); *H01L 29/42372* (2013.01); *H01L 29/4916* (2013.01); *H01L 29/66734* (2013.01); *H01L 29/78* (2013.01); *H01L 29/7802* (2013.01); *H01L 29/7813* (2013.01)

(58) Field of Classification Search
CPC ............ H01L 29/404; H01L 29/407; H01L 29/41741; H01L 29/42372; H01L 29/4916; H01L 29/66734; H01L 29/78; H01L 29/7802; H01L 29/7813
See application file for complete search history.

(56) References Cited

U.S. PATENT DOCUMENTS

| | | |
|---|---|---|
| 8,188,521 B2 | 5/2012 | Saito et al. |
| 8,362,550 B2 | 1/2013 | Rexer et al. |
| 8,399,920 B2 | 3/2013 | Juengling |
| 9,105,713 B2 | 8/2015 | Siemieniec et al. |
| 2005/0029584 A1 | 2/2005 | Shiraishi et al. |
| 2008/0150020 A1 | 6/2008 | Challa et al. |
| 2010/0140689 A1 | 6/2010 | Yedinak et al. |
| 2010/0193864 A1 | 8/2010 | Tokuda |
| 2010/0308399 A1 | 12/2010 | Saito et al. |
| 2011/0133258 A1 | 6/2011 | Chen |
| 2013/0075809 A1 | 3/2013 | Hsieh |

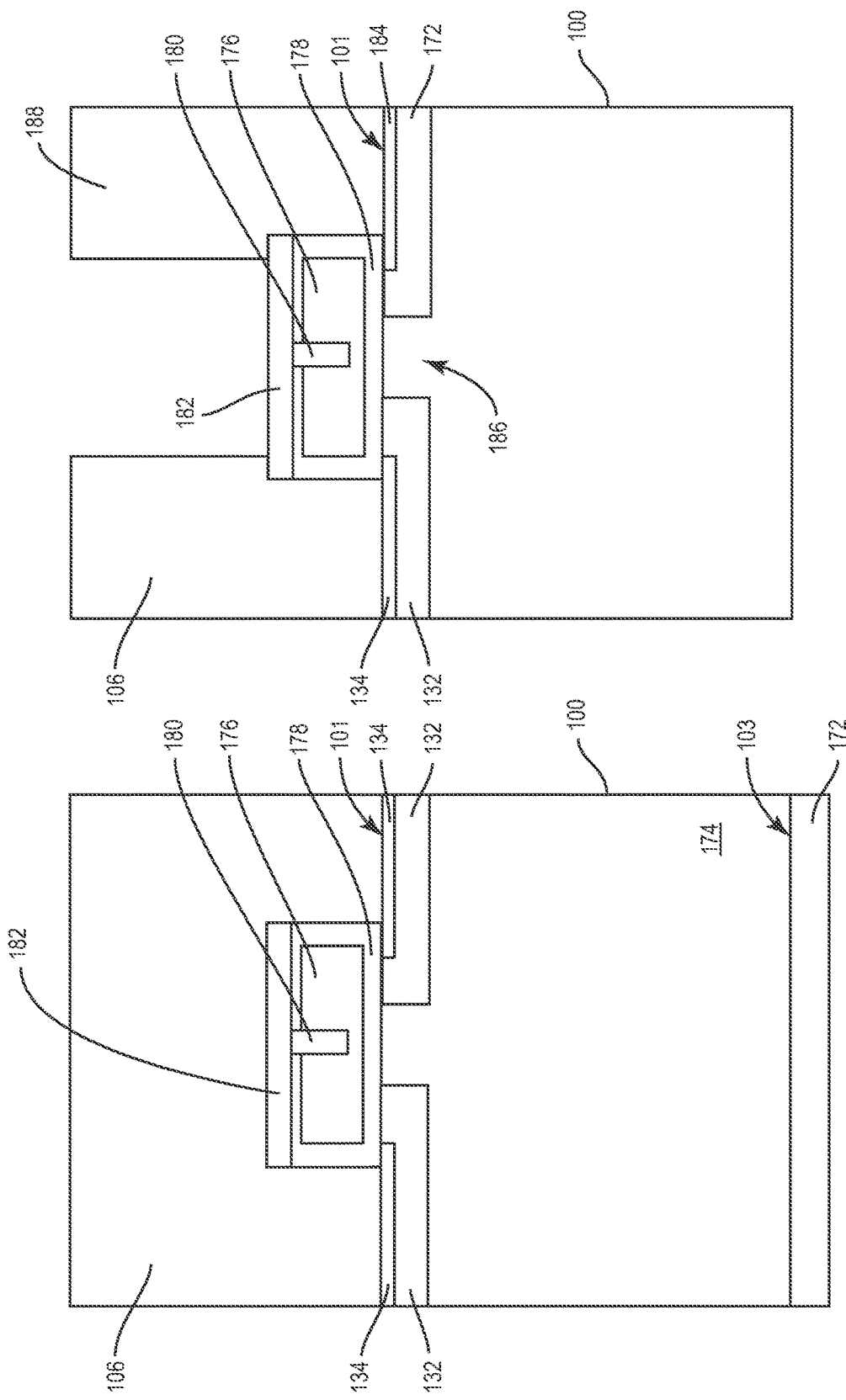

METHOD OF MANUFACTURING A SEMICONDUCTOR DEVICE WITH A METAL-FILLED GROOVE IN A POLYSILICON GATE ELECTRODE

PRIORITY CLAIM

This application is a Divisional of U.S. application Ser. No. 14/747,681 filed on Jun. 23, 2015, which in turn is a Continuation of U.S. application Ser. No. 13/673,458 filed on Nov. 9, 2012, the content of both of said applications incorporated herein by reference in their entirety.

TECHNICAL FIELD

The present application relates to semiconductor devices, in particular semiconductor devices having a polysilicon gate electrode with low gate resistance.

BACKGROUND

Power MOSFETs (metal oxide semiconductor field effect transistors) with trench field plates have been used as fast-switching power devices. The trench field plate provides charge compensation, allowing for much lower Rds (on)×A and lower gate-related FOM (figure of merit). The performance of such devices is limited by inhomogeneous switching effects of the device.

Such effects include inhomogeneous switching due to the distributed gate resistance. For example, parts of the chip in close vicinity to the gate pad follow a rapid change of the gate voltage that is much faster than for parts of the chip more distant to the gate pad. Furthermore, in difference to standard MOSFETs, the charging/discharging of the trench field-plate which provides charges to compensate for the drift region doping is inhomogeneous. In the case of fast transients, the field-plate charges too slowly due to the distributed resistance for its connections and the device may easily enter avalanche locally during the transients, leading to increased switching losses.

It is therefore advantageous to reduce the distributed gate resistance in general and improve the homogeneity of the distribution of the gate signal across the entire chip. Conventional solutions include widening the metal layers which connect the gates with the gate pad to reduce the electrical resistance. However, this measure is limited by the cell pitch. Also, widening the gate fingers requires additional active area. Such drawbacks also apply to equivalent measures for contacting the trench field-plates. Another conventional approach is the introduction of additional gate fingers, which reduces the active area and, thus, increases the Rds(on) of a given chip size. Still another conventional approach involves replacing the polysilicon often used as the gate material with a metal which might also be possible for the trench field-plate in the case of a MOSFET having such a structure. However, the use of metal for the device gate electrode and field-plate strongly impacts the subsequent process steps required to complete the chip fabrication since the maximum allowed temperature for a chip having a metal gate is reduced, which, in turn, limits the type of processing that can be carried out after formation of the metal gate.

SUMMARY

Embodiments described herein provide for a groove formed in the polysilicon gate electrode and optional polysilicon field-plate of a power MOSFET. The grooves are filled with metal to provide a highly conductive layer in the upper part of the gate electrode and field-plate along all stripes (fingers), reducing the overall distributed resistance of the gate and field-plate wiring on a power MOSFET and improving the homogeneity of the MOSFET switching.

According to an embodiment of a semiconductor device, the device comprises a semiconductor substrate, a body region of a first conductivity type in the substrate, a source region of a second conductivity type opposite the first conductivity type adjacent the body region, and a trench extending into the substrate adjacent the source and the body regions. The trench contains a polysilicon gate electrode insulated from the substrate. The device further comprises a dielectric layer on the substrate, a gate metallization on the dielectric layer and covering part of the substrate and a source metallization on the dielectric layer and electrically connected to the source region. The source metallization is spaced apart from the gate metallization and covers a different part of the substrate than the gate metallization. A metal-filled groove in the polysilicon gate electrode is electrically connected to the gate metallization, and it extends along a length of the trench underneath at least part of the source metallization.

According to another embodiment of a semiconductor device, a plurality of trenches spaced apart from one another extend in parallel into the substrate adjacent the source and the body regions, each trench containing a polysilicon gate electrode insulated from the substrate. A metal-filled groove in each polysilicon gate electrode is electrically connected to the gate metallization, and extends along a length of the trenches underneath at least part of the source metallization.

According to yet another embodiment of a semiconductor device, the device comprises a semiconductor substrate, a first semiconductor region of a first conductivity type in the substrate, a second semiconductor region of a second conductivity type opposite the first conductivity type adjacent the first semiconductor region, and a trench extending into the substrate adjacent the first and the second semiconductor regions. The trench contains a polysilicon electrode insulated from the substrate. The device further comprises a dielectric layer on the substrate, a first metallization on the dielectric layer and covering part of the substrate and a second metallization on the dielectric layer and electrically connected to the second region. The second metallization is spaced apart from the first metallization and covers a different part of the substrate than the first metallization. A metal-filled groove in the polysilicon electrode is electrically connected to the first metallization, and extends along a length of the trench underneath at least part of the second metallization.

According to an embodiment of a method of manufacturing a semiconductor device, the method comprises: forming a trench extending into a semiconductor substrate and a polysilicon gate electrode in the trench which is insulated from the substrate; forming a body region of a first conductivity type in the substrate adjacent the trench and a source region of a second conductivity type opposite the first conductivity type adjacent the body region and the trench; forming a dielectric layer on the substrate; forming a gate metallization on the dielectric layer which covers part of the substrate and a source metallization on the dielectric layer which is electrically connected to the source region, the source metallization being spaced apart from the gate metallization and covering a different part of the substrate than the gate metallization; and forming a metal-filled groove in the polysilicon gate electrode which is electrically connected to the gate metallization, the metal-filled groove extending along a length of the trench underneath at least part of the source metallization.

According to another embodiment of a semiconductor device, the semiconductor device comprises a semiconductor substrate, a body region of a first conductivity type in the substrate, a source region of a second conductivity type opposite the first conductivity type adjacent the body region, a drain region of the second conductivity type spaced apart from the source region and a planar gate structure on the substrate. The planar gate structure comprises a polysilicon gate electrode insulated from the substrate and a metal-filled groove in the polysilicon gate electrode. The metal-filled groove extends along a length of the polysilicon gate electrode.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 10 illustrates a cross-sectional view of a vertical DMOS semiconductor device having a planar gate structure including a polysilicon gate electrode with a metal-filled groove according to an embodiment.

FIG. 11 illustrates a cross-sectional view of a lateral CMOS semiconductor device having a planar gate structure including a polysilicon gate electrode with a metal-filled groove according to an embodiment.

DETAILED DESCRIPTION

Figure 1:
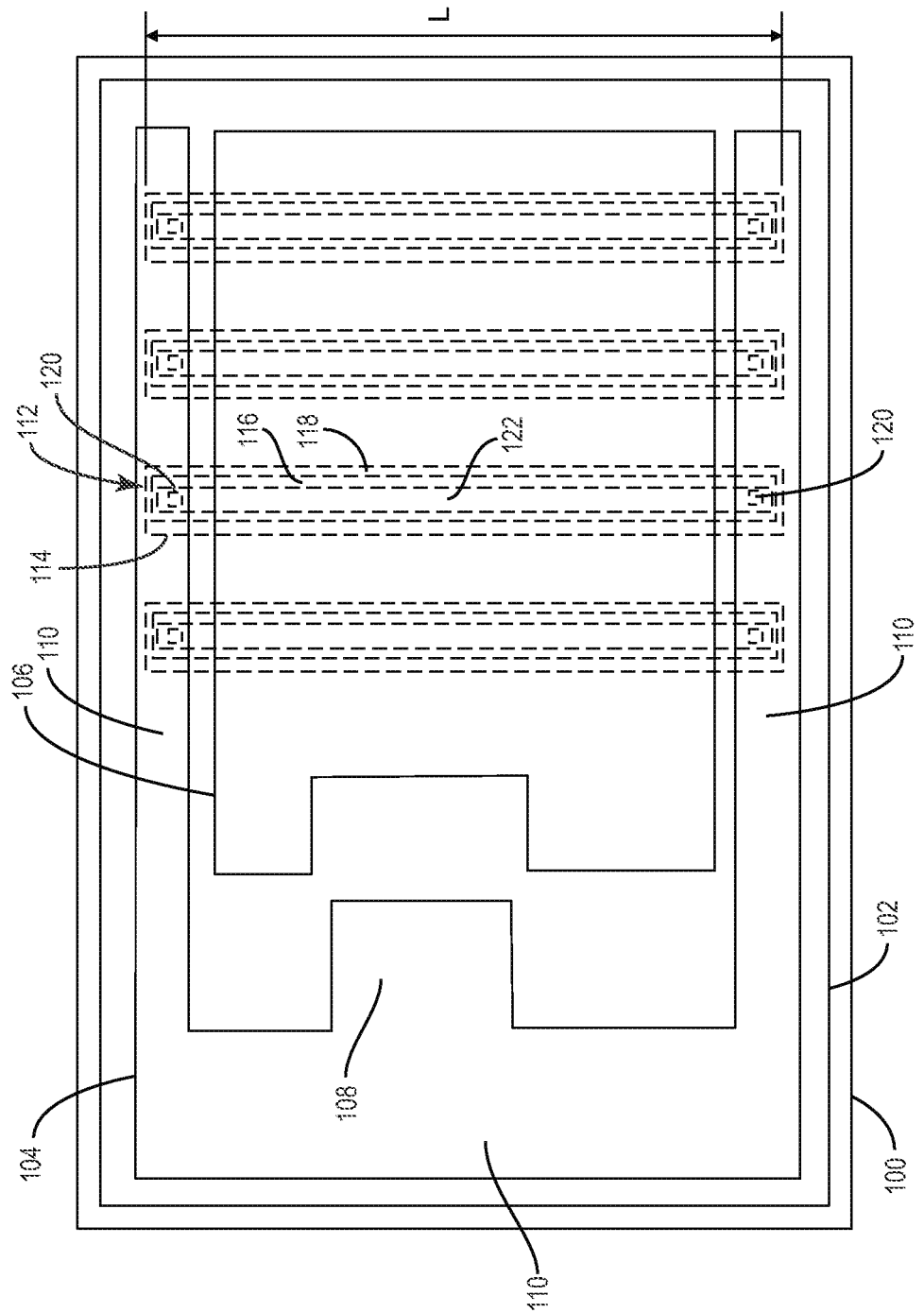
FIG. 1 illustrates a top-down plan view of a semiconductor device having a polysilicon gate electrode with a metal-filled groove according to an embodiment.

FIG. 1 illustrates a top-down plan view of an embodiment of a power semiconductor device such as a power MOSFET fabricated on a semiconductor substrate 100. As used herein, the term substrate refers to a single crystal or compound semiconductor wafer such as a Si, SiC, GaAs or GaN wafer, or one or more epitaxial layers grown on a single crystal or compound semiconductor wafer. In the case epitaxial layer(s) are used, the epitaxial layer(s) are grown on a growth/support substrate and have a lower doping but the same conductivity as the growth/support substrate. The underlying growth/support wafer can be thinned or completely removed. The semiconductor device also includes various device regions such as body, source, drift and drain regions which are out-of-view in the top-down plan view of FIG. 1. A dielectric layer 102 such as BPSG (borophosphosilicate glass) or PSG (phosphosilicate glass) is formed on the substrate 100, and insulates gate and source metallizations 104, 106 of the device from the underlying substrate 100.

The gate metallization 104 covers part of the substrate 100 e.g. the outer periphery of the device as shown in FIG. 1. The gate metallization 104 includes a gate pad 108 and several gate runners 110 which extend outward in different directions from the gate pad to distribute the gate signal to different regions of the device. The source metallization 106 is electrically connected to the source region of the device and covers a different part of the substrate 100 than the gate metallization 104 e.g. the inner part of the device as shown in FIG. 1. In FIG. 1, the gate metallization 104 surrounds the source metallization 106 on three sides. Other gate/source metallization layouts are possible, and within the scope of the embodiments described herein. In each case, the source and gate metallizations 104, 106 are spaced apart from one another to ensure proper operation of the semiconductor device.

The gate structure 112 of the semiconductor device is formed in one or more trenches 114, which are also referred to herein as gate trenches. The gate trenches 114 are illustrated with dashed lines in the top-down plan view of FIG. 1, because the trenches 114 are formed in the semiconductor substrate 100 and covered by the overlying dielectric layer 102 and metallizations 104, 106. If more than one gate structure 112 is provided, the gate structures 112 divide the active area of the device into different cells. In this case, the gate structures 112 extend in parallel like 'fingers' in the semiconductor substrate 100 from one end of the gate metallization 104 to the opposing end as shown in FIG. 1.

Each gate trench 114 extends into the substrate 100 adjacent the source and the body regions (not shown in FIG. 1), and contains a gate electrode 116 made of polysilicon insulated from the substrate 100 by a gate dielectric 118 such as silicon dioxide. In the case of multiple (parallel) gate trenches 114, each polysilicon gate electrode 116 is electrically connected to the gate metallization 104 by one or more conductive vias 120. The conductive vias 120 extend vertically from the gate metallization 104 to the gate electrodes 116 through the intermediary dielectric layer 102 e.g. at both ends of the gate metallization 104 as shown in FIG. 1. The conductive vias 120 are illustrated with dashed lines in the top-down plan view of FIG. 1, because the vias 120 are disposed in the dielectric layer 102 below the overlying metallizations 104, 106.

A metal-filled groove 122 is formed in each polysilicon gate electrode 116. The grooves 122 are filled with metal to provide a metal layer in the upper part of the gate electrodes 116 along all fingers 112. Any suitable metal or metal alloy can be used to fill the grooves 122 in the gate electrodes 116. The type of metal used depends on the technology used to fabricate the device. For example, the grooves 122 can be filled with a single metal such as tungsten, or a metal alloy such as Ti/TiN/W. In each case, the metal-filled grooves 122 extend along a length (L) of the gate trenches 114 underneath at least part of the source metallization 106. In general, providing a metal-filled groove 122 in each polysilicon gate electrode 116 underneath at least part of the source metallization 106 reduces the overall distributed resistance of the device gate and improves the homogeneity of the device switching. The metal-filled grooves 122 can extend along the entire gate trench length, or along part of the gate trench length. In FIG. 1, each metal-filled groove 122 extends continuously from a first end of the corresponding gate trench 114 to the opposing end of the trench 114, and each metal-filled groove 122 is electrically connected to the gate metallization 104 at the first and second ends of the corresponding gate trench 114 by respective conductive vias 120.

Figure 2:
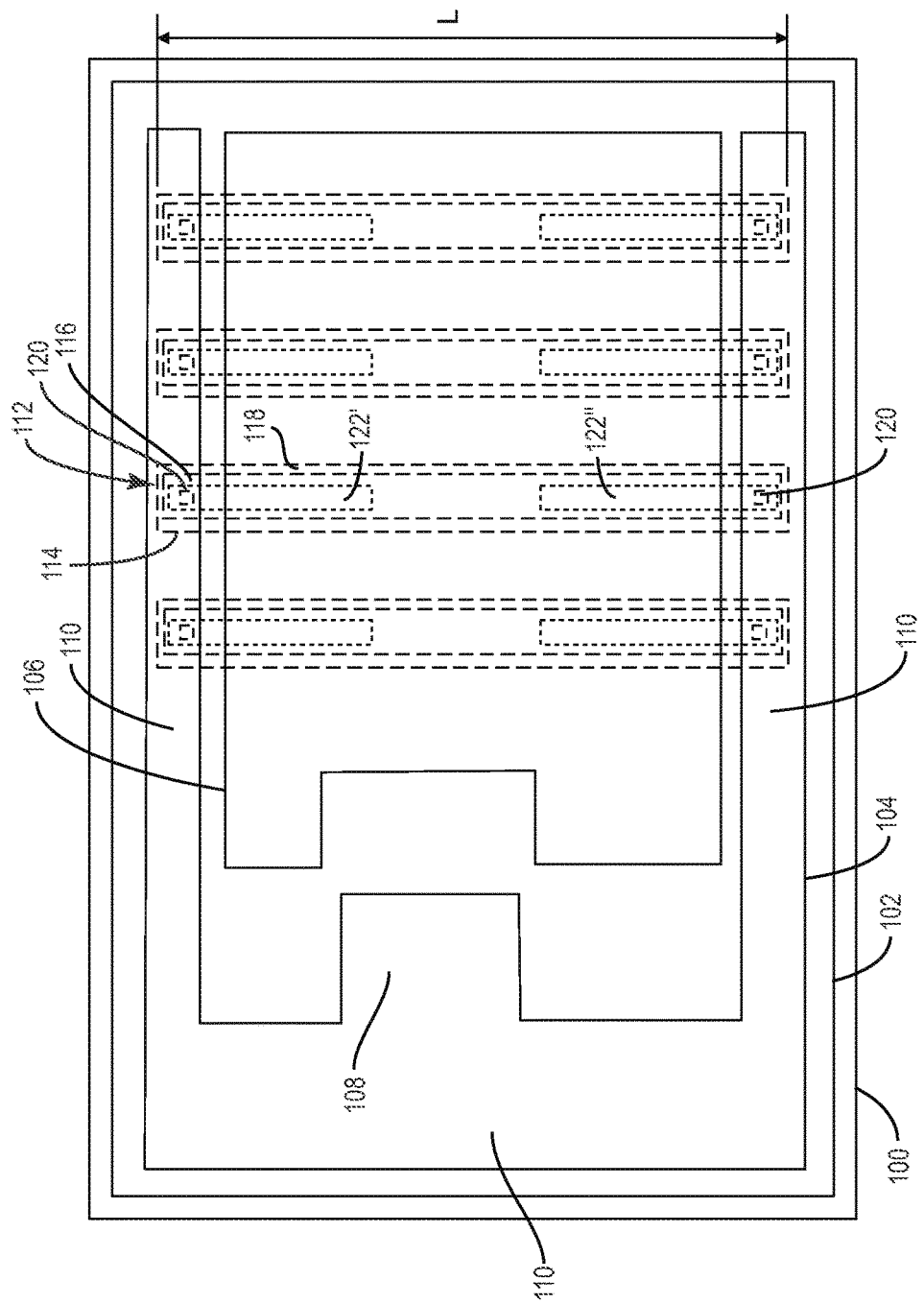
FIG. 2 illustrates a top-down plan view of a semiconductor device having a polysilicon gate electrode with a metal-filled groove according to another embodiment.

FIG. 2 illustrates a top-down plan view of the power semiconductor device according to another embodiment. The embodiment shown in FIG. 2 is similar to the embodiment shown in FIG. 1, however the metal-filled grooves 122 are interrupted at least once over the length (L) of the trenches 114 so that the metal-filled grooves 122 each have at least two different sections 122', 122" spaced apart from each other in the gate trenches 114. Each section 122', 122" of the metal-filled grooves 122 is electrically connected to the gate metallization 104 at one end of the corresponding gate trench 114 by a respective conductive via 120.

Figure 3:
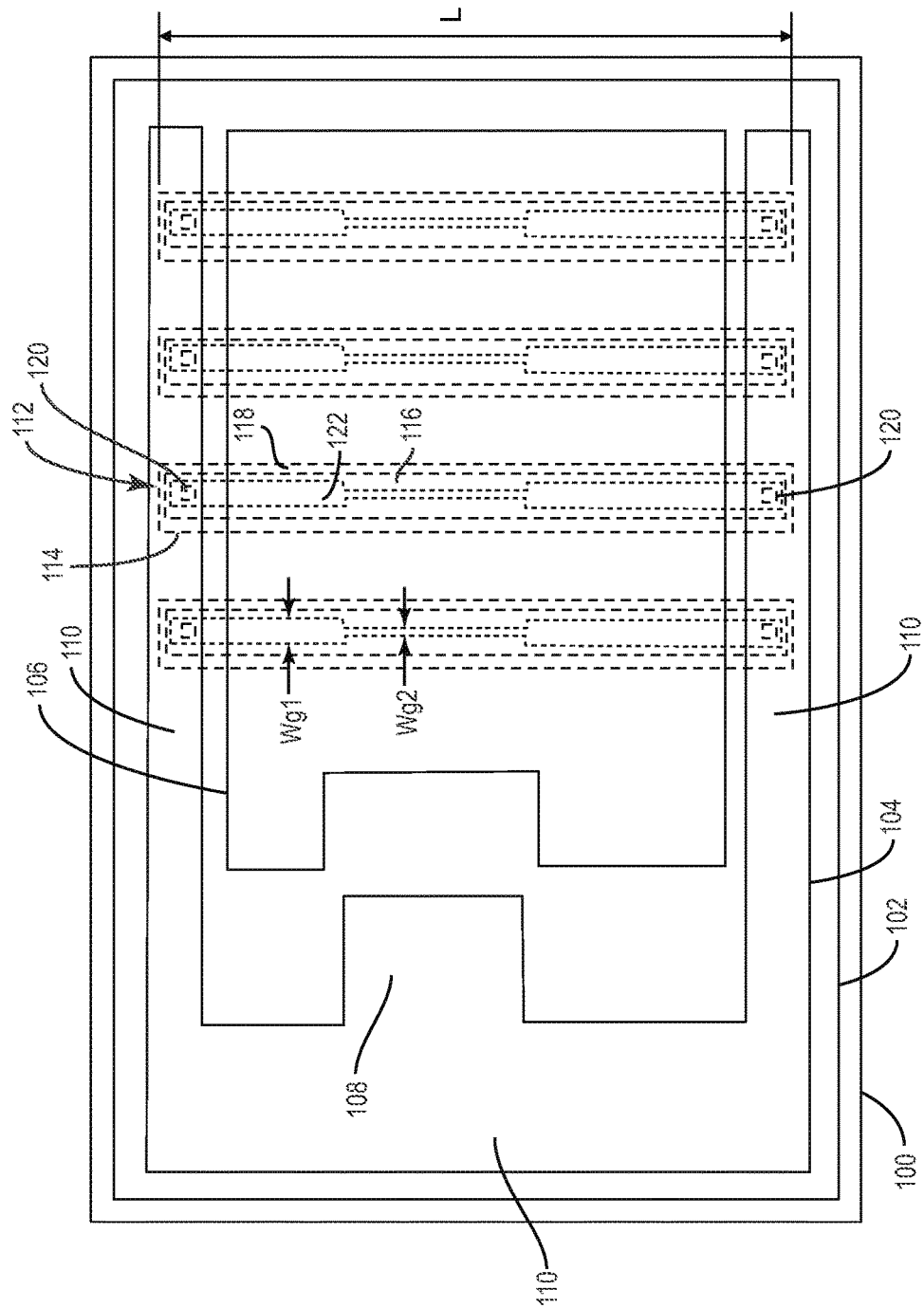
FIG. 3 illustrates a top-down plan view of a semiconductor device having a polysilicon gate electrode with a metal-filled groove according to yet another embodiment.

FIG. 3 illustrates a top-down plan view of the power semiconductor device according to yet another embodiment. The embodiment shown in FIG. 3 is similar to the embodiment shown in FIG. 1, however the cross-sectional area of the metal-filled grooves 122 is reduced over part of the length of the metal-filled grooves 122. The part of each metal-filled groove 122 with a reduced cross-sectional area forms a resistor. In FIG. 3, the reduced cross-sectional area results from narrowing the width (Wg1 versus Wg2) of the metal-filled grooves 122. The depth may also be varied to reduce the cross-sectional area, in addition to or instead of narrowing the width.

Figure 4:
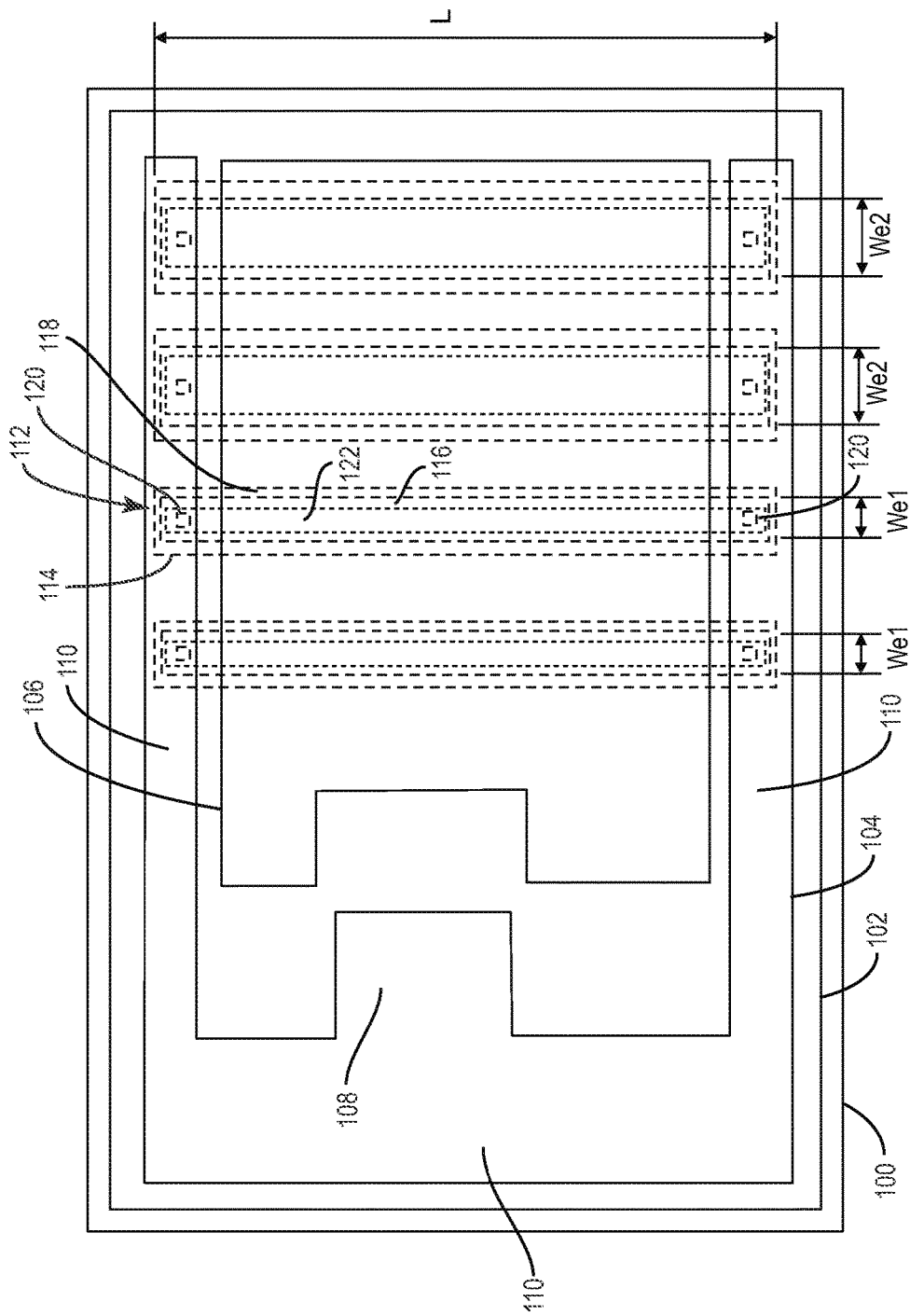
FIG. 4 illustrates a top-down plan view of a semiconductor device having a polysilicon gate electrode with a metal-filled groove according to still another embodiment.

FIG. 4 illustrates a top-down plan view of the power semiconductor device according to still another embodiment. The embodiment shown in FIG. 4 is similar to the embodiment shown in FIG. 1, however the polysilicon gate electrodes 116 disposed further from the gate pad 108 are larger than the polysilicon gate electrodes 116 disposed closer to the gate pad 108. The homogeneity of the switching behavior and current flow is improved by providing a specific gate resistance of the gate fingers 112 which decreases over distance from the gate pad 108. In addition, the gate fingers 112 have decreasing sheet resistance for cells further away from the gate pad 108 by increasing the gate electrode width (We1 versus We2). For example, FIG. 4 shows the two polysilicon gate electrodes 116 disposed closest to the gate pad 108 having a width We1 and the two polysilicon gate electrodes 116 disposed furthest from the gate pad 108 having a width We2 where We2>We1. The thickness (depth) of the polysilicon gate electrodes 116 can also be varied as desired to vary the sheet resistances of the different gate fingers 112. In general, any desirable number of gate fingers 112 can be provided and the gate dimensions can be set as desired by appropriately controlling the lithography processing employed to fabricate the gate trench structures 112 i.e. the gate fingers. Described next are embodiments of a method of fabricating the power semiconductor device.

FIGS. 5A through 5I illustrate cross-sectional views of the power semiconductor device during different stages of manufacture. According to this embodiment, the power semiconductor device includes both polysilicon gate electrodes 116 and polysilicon field plates 124 disposed in trenches 126. The field plates 124 provide charge compensation, allowing for much lower Rds(on)×A and lower gate and gate-to-drain FOM (figure of merit). Each field plate 124 is disposed in a trench 126 formed in the semiconductor substrate 100, and has a metal-filled groove 122. The metal-filled grooves 122 in the polysilicon gate electrodes 116 extend along the length of the gate trenches 114 underneath at least part of the source metallization 106 as previously described herein. The metal-filled grooves 122 in the polysilicon field plates 124 similarly extend along the length of the field plate trenches 126 underneath at least part of the gate metallization 104.

Figure 5A:
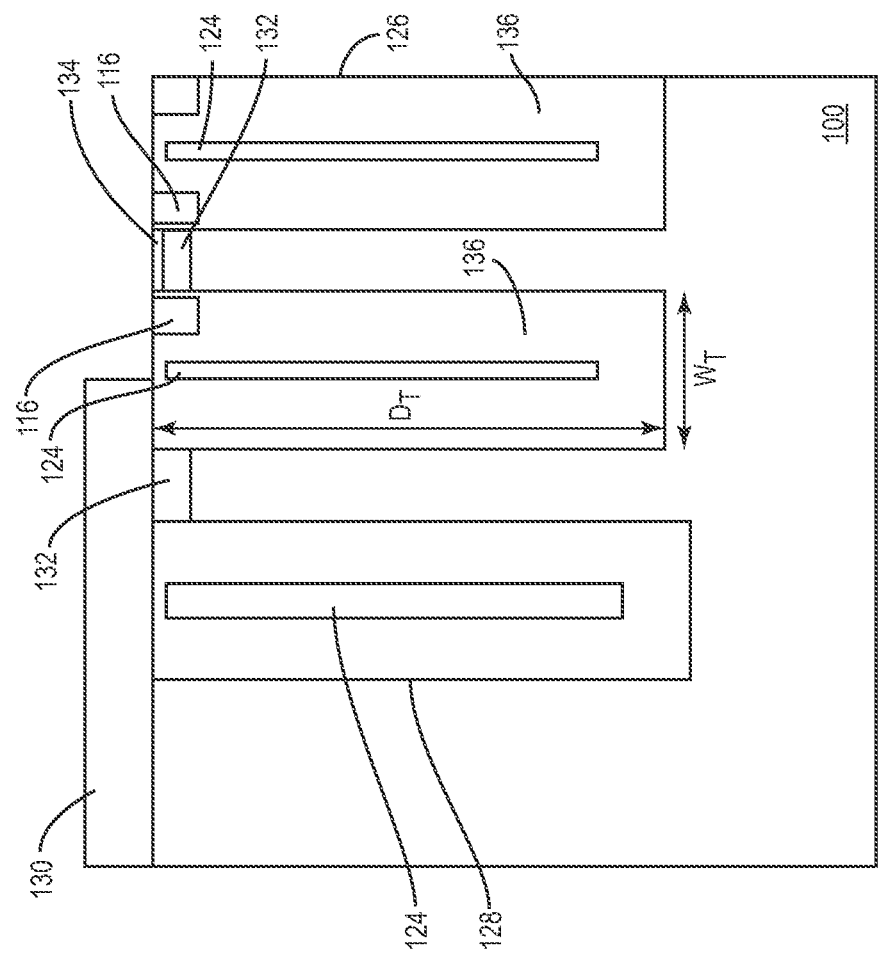
FIGS. 5A through 5I illustrate cross-sectional views of a semiconductor substrate during different stages of manufacturing a semiconductor device having a polysilicon gate electrode with a metal-filled groove according to an embodiment.

FIG. 5A shows the semiconductor substrate 100 after completion of various conventional steps such as trench formation, gate electrode/field plate formation and isolation, and source region formation. Some field plates 124 are disposed in the same trench 126 as one of the gate electrodes 116 according to this embodiment. An additional field plate 124 can be disposed in the edge of the device under the gate metallization 104 and the source metallization 106 in a trench 128 without a gate electrode 116. Alternatively, the field plates 124 and the gate electrodes 116 can be disposed in different trenches altogether. In each case, part of the substrate 100 is protected by a resist 130. Dopants are implanted into the unprotected body regions 132 to form the source regions 134 of the device adjacent the body regions 132. The body regions 132 are of a first conductivity type (i.e. p-type or n-type), and the source regions 134 are of the opposite (second) conductivity type (i.e. n-type or p-type).

In the case the substrate 100 comprises an epitaxial layer, the epitaxial layer is of the second conductivity type and a lower doped drift region of the device and of the second conductivity type is disposed in the epitaxial layer. The trenches 126, 128 extend into the drift region according to this embodiment. Alternatively, the substrate 100 can be a low-doped semiconductor wafer which is thinned and provided with a high-dose backside implant to form the drain contact.

In each case, each trench 126 that contains a gate electrode 116 and a field plate 124 extends into the substrate 100 adjacent the body and the source regions 132, 134, to a depth Dt. The trenches 126 also have a cross-sectional width Wt. The length of the trenches 126 extends in a direction into FIG. 5A. The gate electrode 116 and the field plate 124 are both made of polysilicon, and are insulated from each other and from the substrate 100 by a gate dielectric 118 and a field oxide 136, respectively. The substrate 100 has been processed in accordance with conventional techniques to this point, so no further description is given in this regard.

Figure 5B:
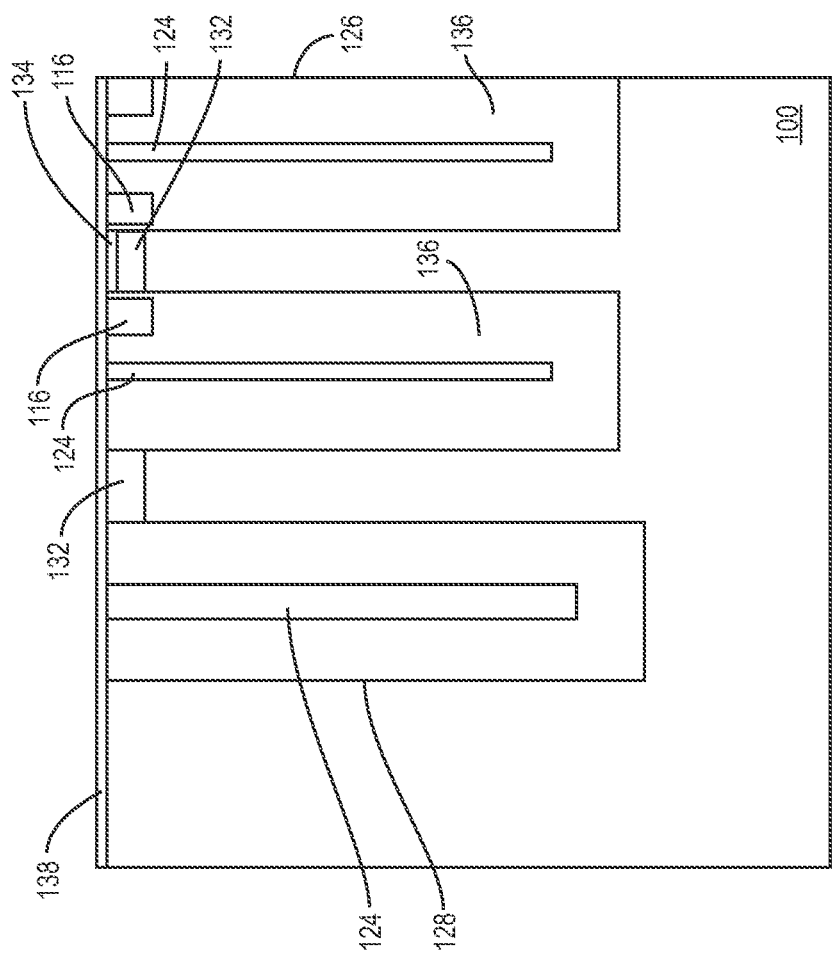

FIG. 5B shows the substrate 100 after a passivation layer 138 such as oxynitride and/or USG (undoped silicate glass) is formed on the substrate 100. The thickness of the metal-filled grooves to be subsequently formed in the gate electrodes 116 and the field plates 124 is defined by the thickness of the passivation layer 138. As such, the overall resistance of the gate electrodes 116 and the field plates 124 can be adjusted by varying the passivation layer thickness. For example, the thickness can range from 150 to 400 nm for a passivation layer 138 made of USG. Using more than two gate fingers 110 is also possible in case a very low gate resistance is needed.

Figure 5C:
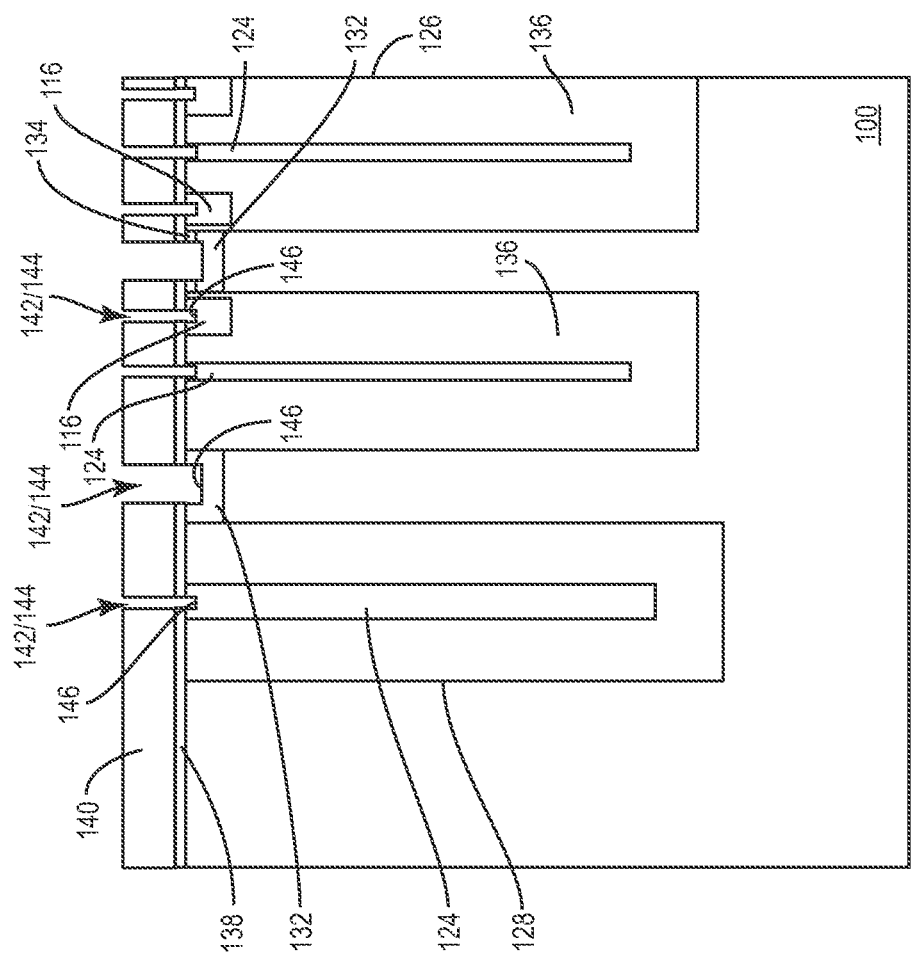

FIG. 5C shows the substrate 100 after a resist layer 140 is formed on the passivation layer 138 and patterned to form openings 142 in the resist 140. The underlying passivation layer 138 is then etched through the openings 142 in the resist 140. The aspect ratio of the resulting openings 144 in the passivation layer 138 depends on the thickness of the resist 140. Grooves 146 are then formed in the top (exposed) side of the gate electrodes 116, field plates 124 and sources regions 132 e.g. by conventional etching. As previously described herein, the cross-sectional area of the gate electrode and/or field plate grooves 146 can be reduced along certain part(s) of the trench length to form a resistor when the grooves 146 are filled with a metal (see FIG. 3). Also, the grooves 146 can be physically divided into multiple spaced-apart sections also as previously described herein (see FIG. 4). Furthermore, the depth of the grooves 146 in the polysilicon defines the overall resistance since the grooves 146 are subsequently filled with metal as described in more detail later herein. Such adjustments to the dimensions of the grooves 146 can be performed during the lithography processing illustrated in FIG. 5C.

Figure 5D:
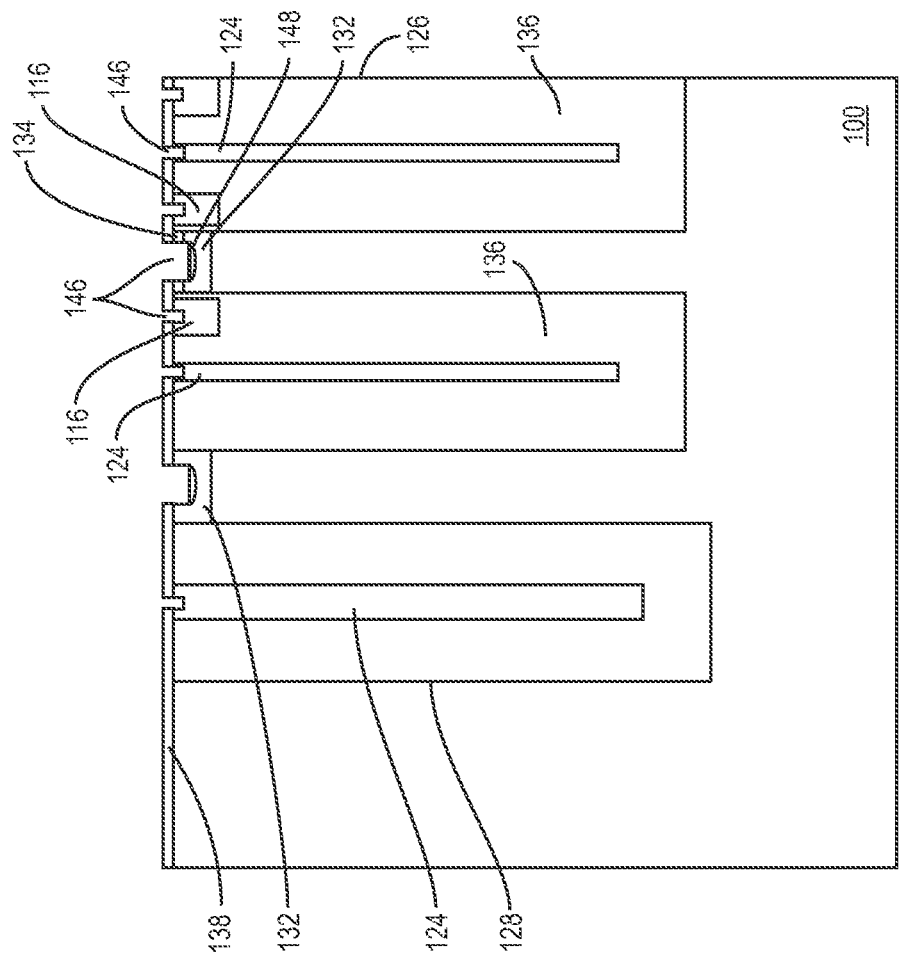

FIG. 5D shows the substrate 100 during body region implantation. The body implant dose can be chosen so that a good p-type contact 148 is formed in the body region 134, while also maintaining sufficient n-type doping in the source region 132. An optional scattering oxide (not shown in FIG. 5D) can be formed to avoid sidewall implantation. The body contact implantation need not be limited to the source pad region. That is, body contacts 148 can also be implanted under the gate runners 110 at the periphery of the device to improve the blocking capability of the device. Also, the grooves 146 prevent ions like sodium from entering the active cell field since the trenches 126 and thus the grooves 146 can surround the complete chip. The body implantation process is indicated by downward facing arrows in FIG. 5D.

Figure 5E:
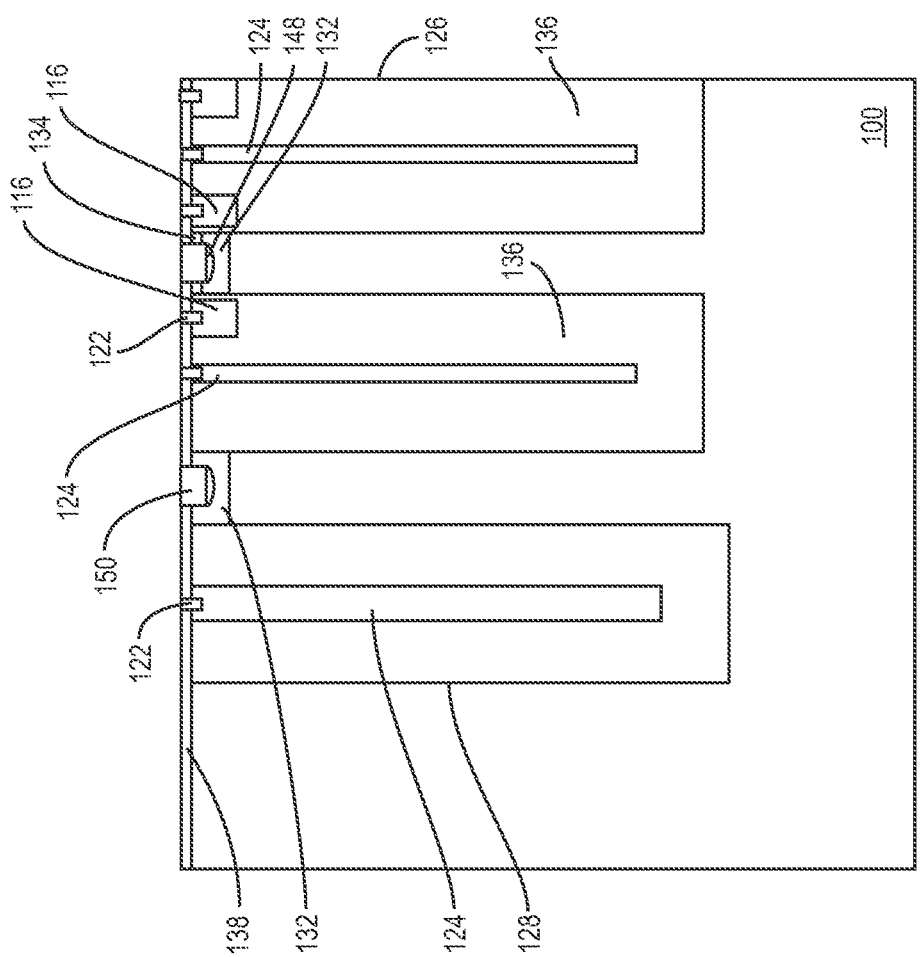

FIG. 5E shows the substrate 100 after metal is deposited in the grooves 146 formed in the gate electrodes 116 and the field plates 124, and in the openings etched through the source region 132 to the body region 134. Any suitable metal or metal alloy can be used. For example, Ti/TiN/W can be used. In other embodiments, TiW can be used. Various other metallurgical combinations are possible and within the scope of the embodiments described herein. The metal can be removed from the surface of the passivation layer 138 e.g. by plasma etching and/or CMP (chemical mechanical polishing). The metal can be recessed further if desired to more precisely control the target resistance of the gate electrodes 116 and field plates 124. In each case, the resulting metal-filled grooves 122 formed in the trench electrodes 116 and the field plates 124 collectively lower the overall resistance of these regions because some polysilicon has been removed and replaced by a more conductive metal material. Metal source/body contacts 150 are also formed.

Figure 5F:
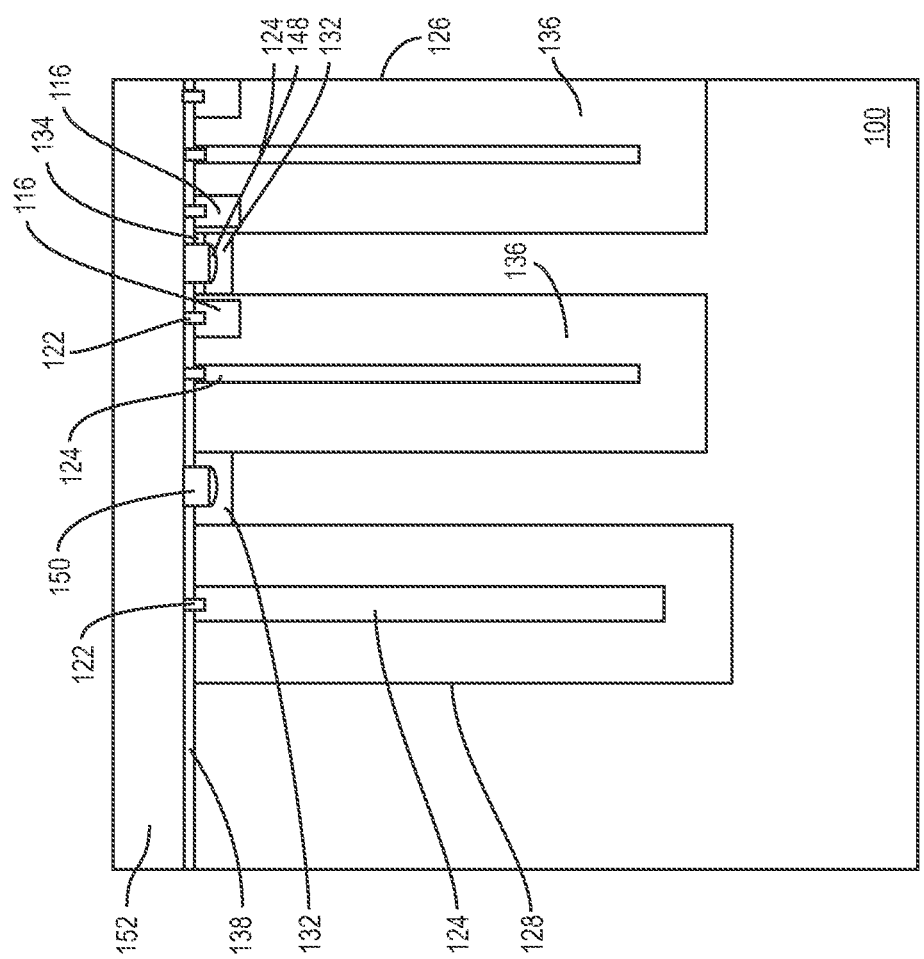

FIG. 5F shows the substrate 100 after an inter-layer dielectric 152 such as BPSG (borophosphosilicate glass) or PSG (phosphosilicate glass) is formed on the passivation layer 138 and the metal-filled grooves 122. Any suitable conventional inter-layer dielectric 152 can be used.

Figure 5G:
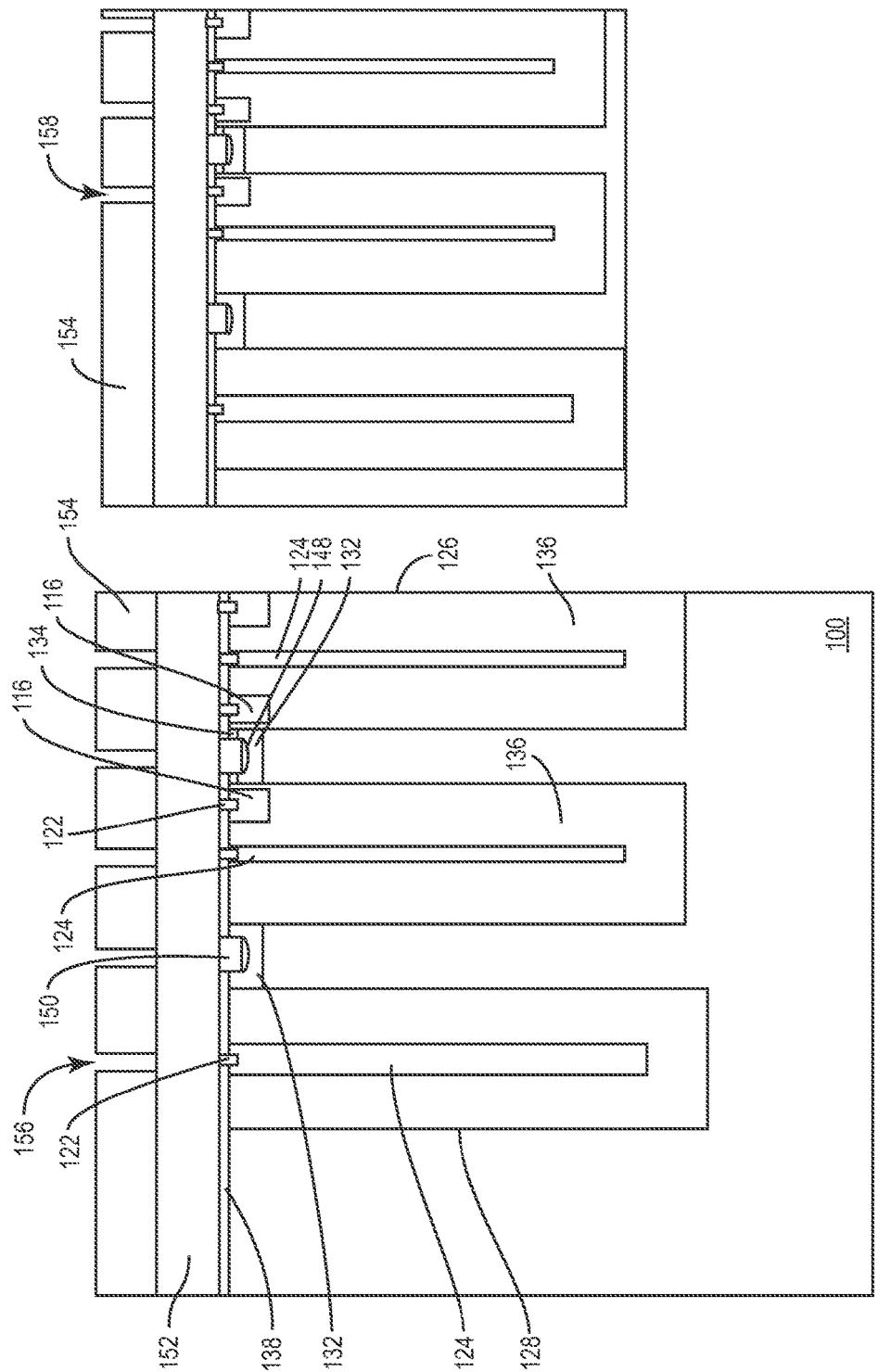

FIG. 5G shows two different sections of the substrate 100, after a resist 154 is formed on the inter-layer dielectric 152 and openings 156, 158 are formed in the resist 154. The left-hand view of FIG. 5G shows a part of the device to be connected to the source metallization 106 (i.e. the source and body regions 132, 134, and the field plates 124) and the right-hand view of FIG. 5G shows a part of the device to be connected to the gate metallization 104 (i.e. the gate electrodes 116).

Figure 5H:
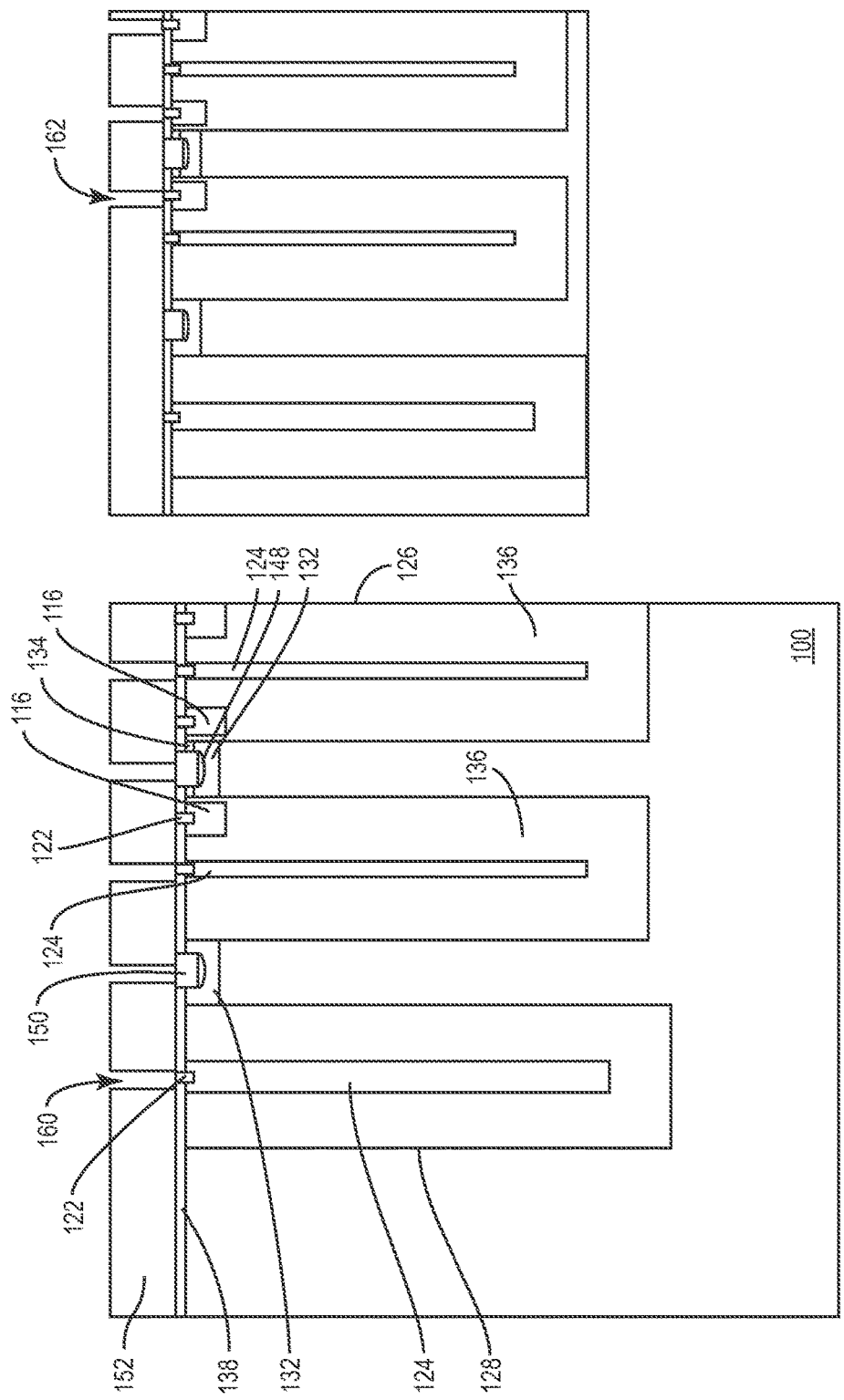

FIG. 5H shows the same two sections of the substrate 100 as in FIG. 5G, after openings 160, 162 are formed through the inter-layer dielectric 152. The openings 160, 162 can be formed in the inter-layer dielectric 152 e.g. by anisotropic etching, and correspond to the openings 156, 158 previously formed in the resist 154. After the inter-layer dielectric openings 160, 162 are formed, the top side of the metal-filled grooves 122 and of the metal source/body contacts 150 are exposed as shown in FIG. 5H.

Figure 5I:
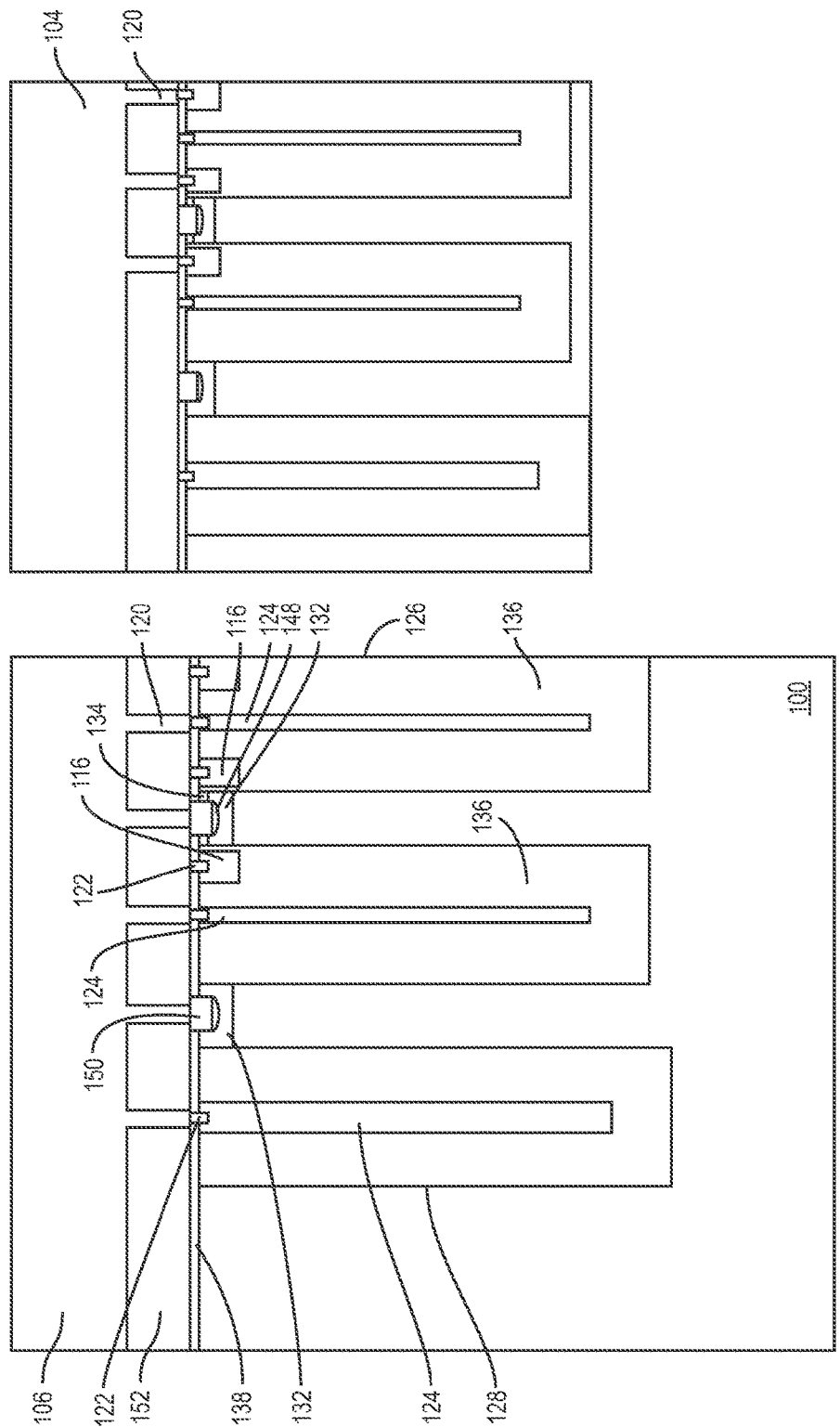

FIG. 5I shows the same two sections of the substrate 100 as in FIGS. 5G and 5H, after the gate metallization 104 is formed on a section of the inter-layer dielectric 152 covering one part of the substrate 100 and the source metallization 106 is formed on another section of the dielectric layer 152 covering a different part of the substrate 100 than the gate metallization 104. The separate gate and source metallizations 104, 106 can be formed by depositing a metal layer on the substrate 100 which fills the openings 160, 162 in the inter-layer dielectric 152. The metal layer is then masked by a resist and etched. The etch process separates the gate and the source metallizations 104, 106. The gate metallization 104 fills the openings 162 in the inter-layer dielectric 152 which extend to the metal-filled grooves 122 in the gate electrode 116. The source metallization 106 similarly fills the openings 160 in the inter-layer dielectric 152 which extend to the metal-filled grooves 122 in the field plates 124 and to the source/body contacts 150. Replacing part of the polysilicon gate electrode 116 and polysilicon field plates 124 with metal-filled grooves 122 lowers the overall resistance of the gate electrodes 116 and field plates 124. In addition, the metal-filled grooves 122 prevent ions such as sodium from entering the active cell field since the metal-filled grooves 122 can surround the entire chip. Each polysilicon gate electrode 116 is electrically connected to the gate metallization 104 and each field plate 124 is electrically connected to the source metallization 106 by one or more conductive vias 120.

The embodiment illustrated in FIGS. 5A through 5I includes the gate electrodes 116 in the same trench 126 as the field plates 124. In other embodiments, the gate electrodes 116 are in different trenches than the field plates 124.

Figure 6:
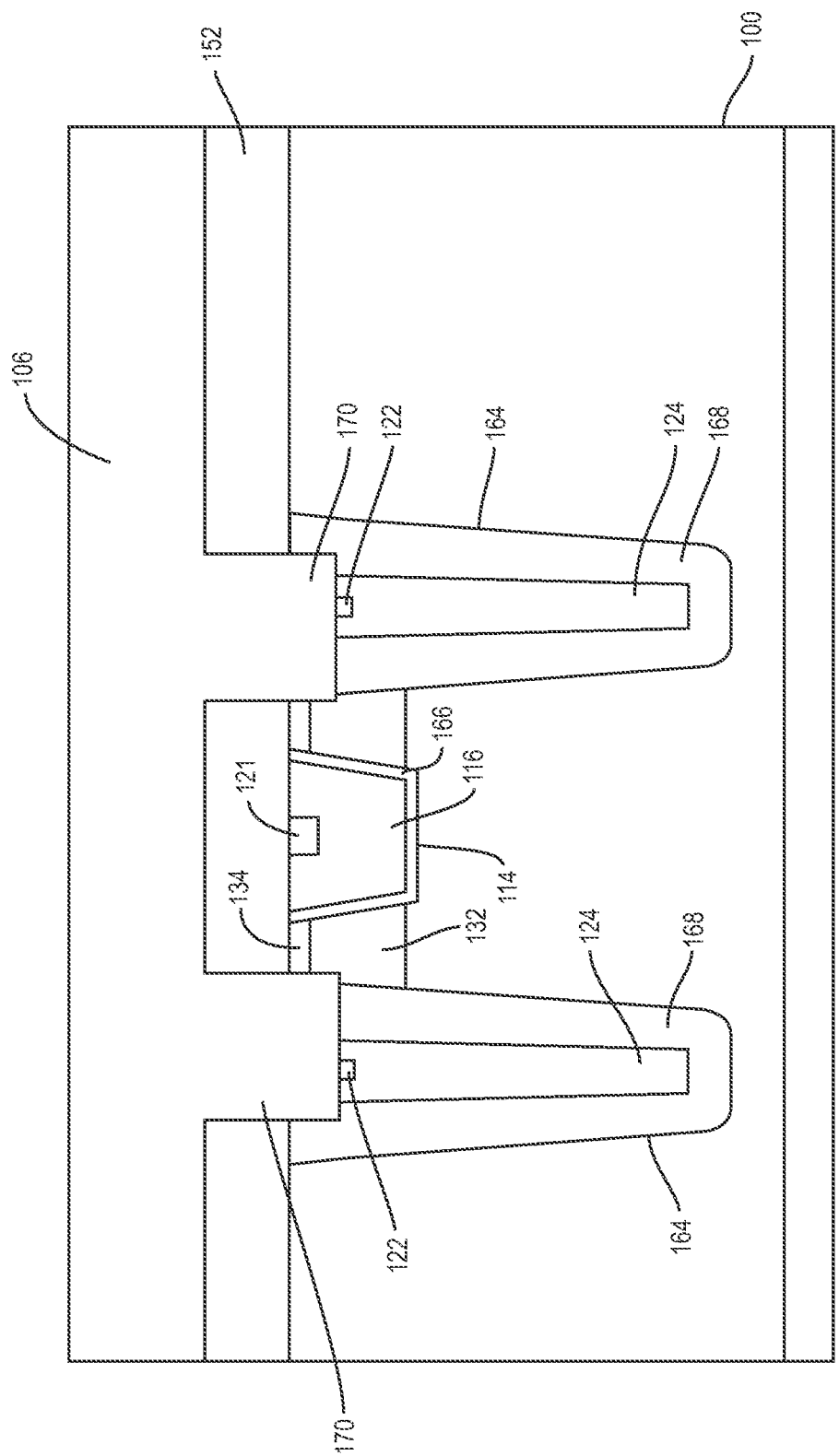
FIG. 6 illustrates a cross-sectional view of a semiconductor device having a polysilicon gate electrode with a metal-filled groove according to an embodiment.

FIG. 6 illustrate a cross-sectional view of the power semiconductor device according to yet another embodiment. According to this embodiment, the gate electrodes 116 are disposed in different trenches 114 than the field plates 124. The gate electrodes 116 are insulated from the surrounding semiconductor material by a gate dielectric 166. The field plates 124 are similarly insulated from the surrounding semiconductor material by a field plate dielectric 168 which is thicker than the gate dielectric 166. The gate trenches 114 and the field plate trenches 164 are spaced apart from one another and extend into the substrate 100 adjacent the body and the source regions 132, 134. A set of conductive vias 170 extend from the source metallization 104 through the inter-layer dielectric 152 to the metal-filled grooves 122 in the field plates 124. These conductive vias 170 contact the source and the body regions 132, 134 as shown in FIG. 6 to ensure proper device operation. A different set of conductive vias (out-of-view in FIG. 6) extend from the gate metallization 104 through the inter-layer dielectric 152 and contact the metal-filled grooves 122 formed in the gate electrodes 116.

As previously described herein, the cross-sectional area of the gate electrode and/or field plate metal-filled grooves 122 can be reduced along certain part(s) of the trench length to form a resistor (see FIG. 3). Also, the metal-filled grooves 122 can be physically divided into multiple sections also as previously described herein (see FIG. 4). Such adjustments to the dimensions of the metal-filled grooves 122 can be performed during the groove lithography processing as previously described herein e.g. with regard to FIG. 5C. For example, a resistor can be provided to improve the switching homogeneity along one finger (stripe) by appropriately structuring the corresponding metal-filled groove 122 along the finger. If a part of this metal-filled groove 122 is removed between the area connecting the overlying gate metallization 104 to the polysilicon gate electrode 116 and the active area, the remaining gate polysilicon in between the removed groove areas essentially acts like a resistor. Identical measures can be used for the metal-filled grooves 122 in the field plates 124. Also, separate resistors can be integrated into the chip to provide a resistive element between the gate pad and the chip area itself.

Figure 7:
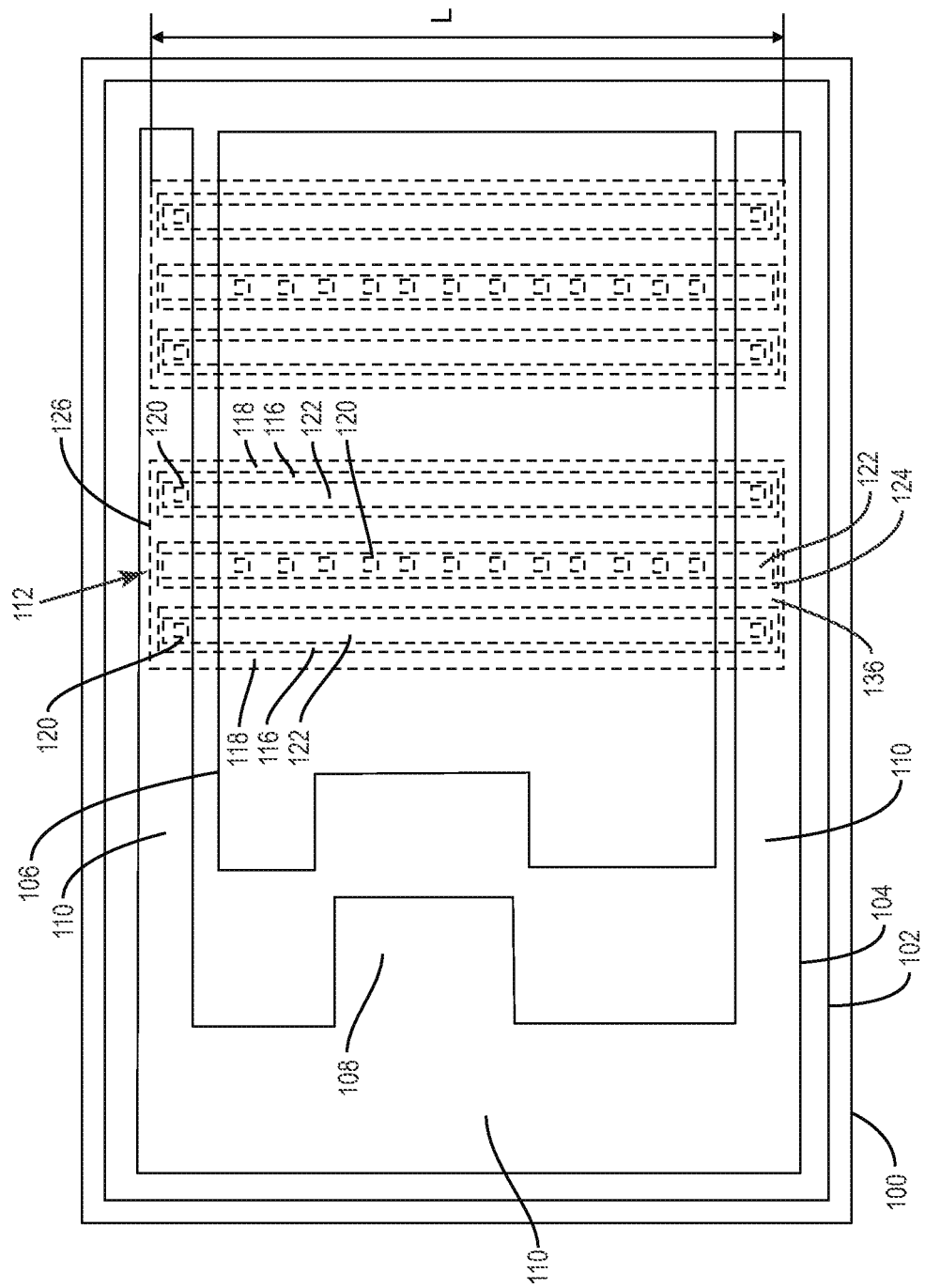
FIG. 7 illustrates a top-down plan view of a semiconductor device having a polysilicon gate electrode and a field plate in the same trench and with respective metal-filled grooves according to an embodiment.

FIG. 7 illustrates a top-down plan view of the power semiconductor device manufactured according to the method shown in FIGS. 5A through 5I. The polysilicon gate electrodes 116 and the field plates 124 are disposed in the same trench 126 as described in accordance with FIGS. 5A through 5I and the corresponding text.

Figure 8:
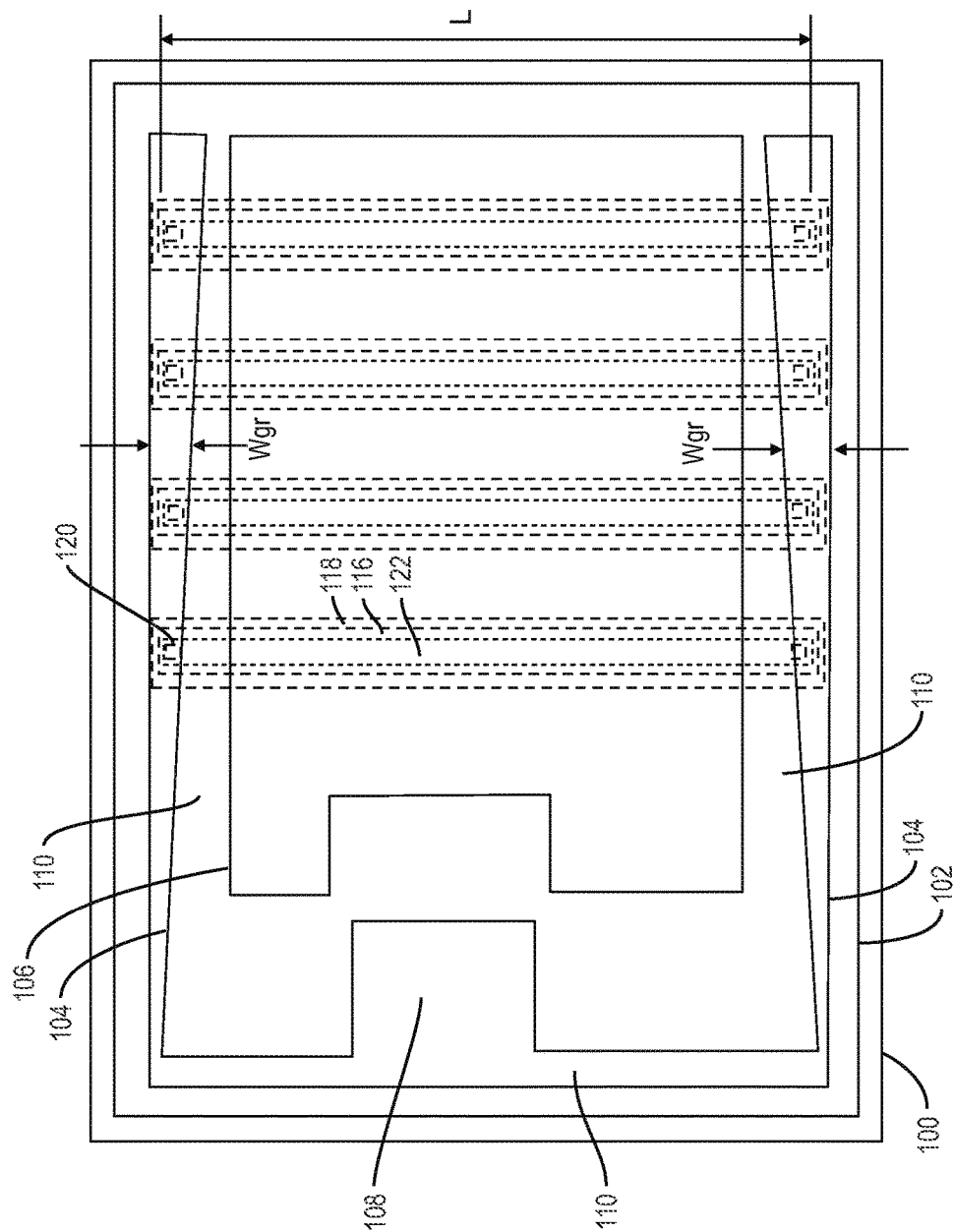
FIG. 8 illustrates a top-down plan view of a semiconductor device having a polysilicon gate electrode with a metal-filled groove and gate runners of varying length according to an embodiment.

FIG. 8 illustrates a top-down plan view of the power semiconductor device according to yet another embodiment. The embodiment shown in FIG. 8 is similar to the embodiment shown in FIG. 1, however the width (Wgr) of the gate runners 110 of the gate metallization 104 increases as the gate runners extend further outward from the gate pad 108. Widening the gate runners 110 along the sides of the device in this way counter-balances the increasing resistance over the length of the gate runners 110.

Figure 9:
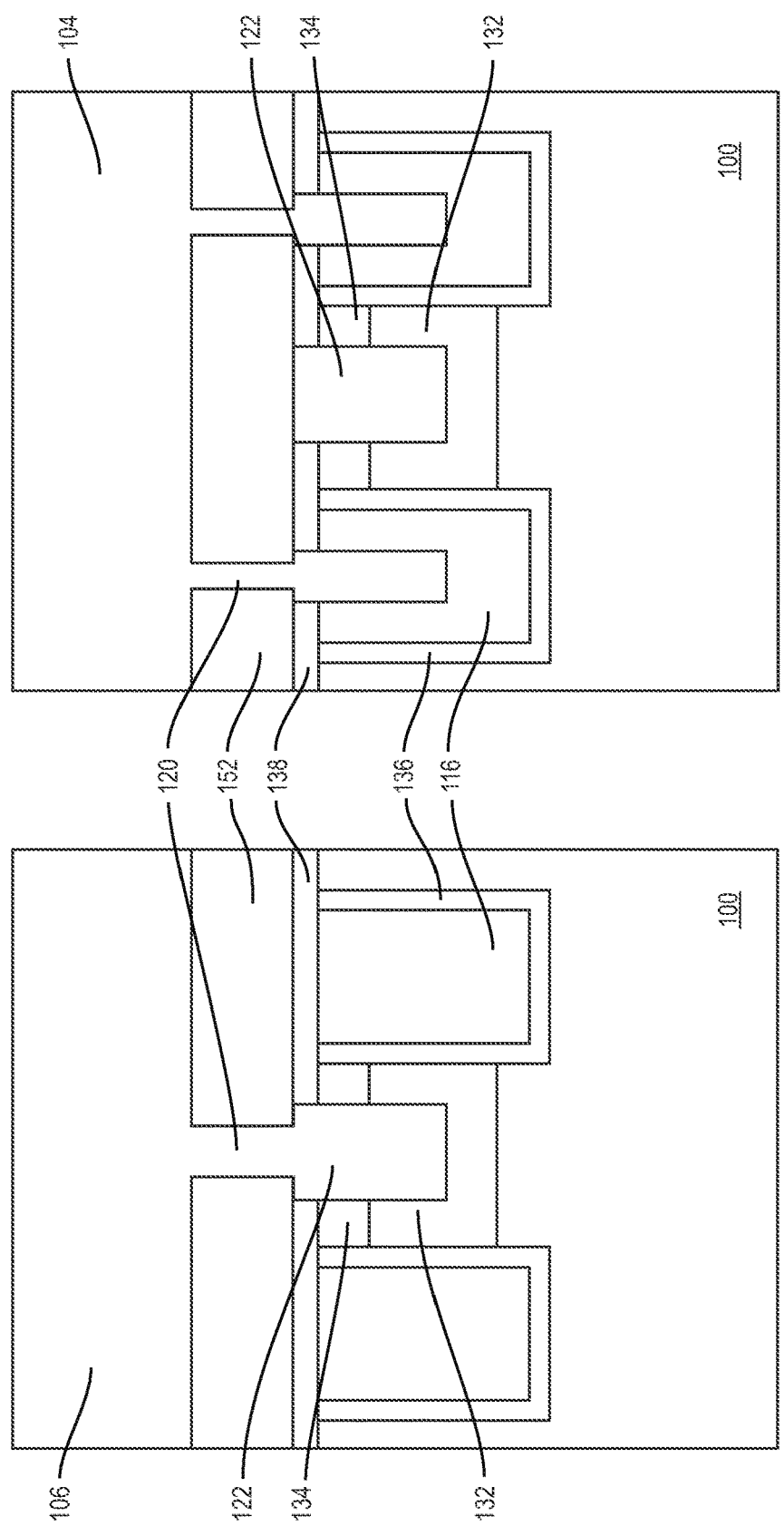
FIG. 9 illustrates a cross-sectional view of a semiconductor device having a polysilicon gate electrode with a metal-filled groove according to an embodiment.

FIG. 9 shows two sections of the power semiconductor device in cross-sectional view according to still another embodiment. According to this embodiment, field plates (if provided) are disposed in a different trench than the polysilicon gate electrodes 116. The left-hand side of FIG. 9 shows a section of the device where conductive vias 120 connect the source metallization 106 to the body and source regions 132, 134. The right-hand side of FIG. 9 shows a section of the device where conductive vias 120 connect the gate metallization 104 to the metal-filled grooves 122 disposed in the polysilicon gate electrodes 116.

FIG. 10 illustrate a cross-sectional view of the power semiconductor device implemented as a DMOS (double-diffused metal-oxide semiconductor) device. According to this embodiment, the gate structure of the DMOS device is planar and disposed on a first surface 101 of the substrate 100. The body and source regions 132, 134 of the DMOS device are disposed at the first surface 101. The drain 172 of the DMOS device is disposed at the opposing surface 103 of the substrate 100 and separated from the body and source regions 132, 134 by a drift region 174. Thus, the DMOS device is a vertical device in that the current flow direction is between the opposing surfaces 101, 103 of the device from the source 134 to the drain 172. The planar gate structure of the DMOS device includes a polysilicon gate electrode 176 spaced apart from the first surface 101 of the substrate 100 by a gate dielectric 178. A metal-filled groove 180 is formed in the planar polysilicon gate electrode 176 as previously described herein. The metal-filled groove 180 extends along a length of the polysilicon gate electrode 176 i.e. into the page in FIG. 10, and is insulated from the source metallization 106 by an insulating material 182.

FIG. 11 illustrate a cross-sectional view of the power semiconductor device implemented as a CMOS (complementary metal-oxide semiconductor) device. According to this embodiment, the gate structure of the CMOS device is planar and disposed on the first surface 101 of the substrate 100. The source region 134 is disposed in the body region 132 at one part of the first surface 101. The drain 172 of the CMOS device is disposed at the same surface 101 of the substrate 100 as the body and source regions 132, 134. The drain 172 may include a heavily-doped drain contact region 184 for decreasing the resistance at this interface. The drain 172 is separated from the body and source regions 132, 134 by a lateral channel region 186. Thus, the CMOS device is a lateral device in that the current flow direction is from the source 134 to the drain 172 at the same surface 101 of the device. The planar gate structure has a similar construction as shown in FIG. 10, however the source and drain metallizations 106, 188 are disposed at the same side of the device and insulated from the polysilicon gate electrode 176 by an insulating material 182. The metal-filled groove 180 formed in the planar polysilicon gate electrode 176 contacts the gate metallization 104 in a plane than which is out-of-view in FIG. 11.

Figure 12:
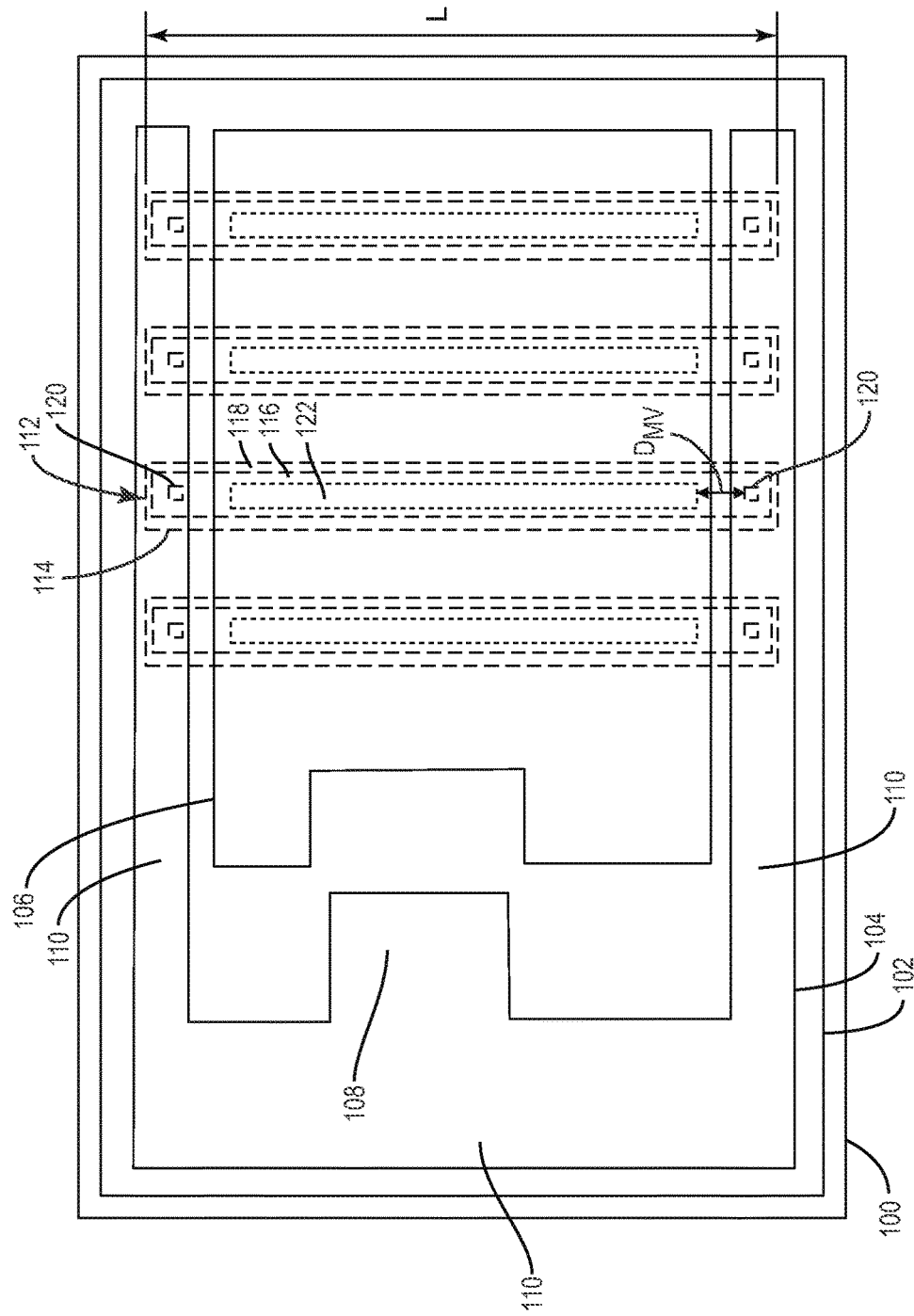
FIG. 12 illustrates a top-down plan view of a semiconductor device having a polysilicon gate electrode with a metal-filled groove in the active area of the device according to an embodiment.

FIG. 12 illustrates a top-down plan view of the power semiconductor device according to still another embodiment. The embodiment shown in FIG. 12 is similar to the embodiment shown in FIG. 1, however the metal-filled grooves 122 formed in the polysilicon gate electrodes 116 extend along the length of the trenches 114 only in the active area of the device i.e. only under the source metallization 106 in FIG. 12. As such, the metal-filled grooves 122 are spaced apart by a distance Dmv from the nearest conductive via 120 contacting the gate electrode 116 according to this embodiment. A sufficiently low integrated gate resistance can be provided between the metal-filled grooves 122 and the conductive vias 120 contacting the gate electrodes 116 if the polysilicon doping of the gate electrodes 116 is low enough.

Terms such as "same", "match" and "matches" as used herein are intended to mean identical, nearly identical or approximately so that some reasonable amount of variation is contemplated without departing from the spirit of the invention. The term "constant" means not changing or varying, or changing or varying slightly again so that some reasonable amount of variation is contemplated without departing from the spirit of the invention. Further, terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing a semiconductor device, the method comprising:
   forming a trench extending into a semiconductor substrate and a polysilicon gate electrode in the trench which is insulated from the substrate;
   forming a body region of a first conductivity type in the substrate adjacent the trench and a source region of a second conductivity type opposite the first conductivity type adjacent the body region and the trench;
   forming a dielectric layer on the substrate;
   forming a gate metallization on the dielectric layer which covers part of the substrate and a source metallization on the dielectric layer which is electrically connected to the source region, the source metallization being spaced apart from the gate metallization and covering a different part of the substrate than the gate metallization; and
   forming a metal-filled groove in the polysilicon gate electrode which is electrically connected to the gate metallization, the metal-filled groove extending along a length of the trench underneath at least part of the source metallization.

2. The method of claim 1, wherein forming the metal-filled groove in the polysilicon gate electrode comprises:
   forming a passivation layer on the substrate before the dielectric layer and the gate and the source metallizations are formed;
   forming an opening in a part of the passivation layer disposed over the polysilicon gate electrode, the opening extending along a length of the polysilicon gate electrode and having a smaller width than the polysilicon gate electrode;
   etching a groove into the polysilicon gate electrode through the opening in the passivation layer; and
   filling the groove with metal.

3. The method of claim 2, wherein filling the groove with metal comprises filling the groove with at least one of Ti/TiN/W and TiW.

4. The method of claim 2, wherein the passivation layer comprises oxynitride and/or undoped silicate glass.

5. The method of claim 2, wherein a thickness of the metal-filled groove is defined by a thickness of the passivation layer.

6. The method of claim 5, wherein the thickness of the passivation layer ranges from 150 nm to 400 nm.

7. The method of claim 2, further comprising:
   recessing the metal below a top surface of the passivation layer.

8. The method of claim 1, wherein the source metallization is electrically connected to the source region and the metal-filled groove is electrically connected to the gate metallization by:
   forming a first group of openings through the dielectric layer to the metal-filled groove and a second group of openings through the dielectric layer to the source region;
   filling the first and second groups of openings and covering the dielectric layer with metal; and
   separating the metal to form the gate metallization on the dielectric layer and electrically conductive vias in the first group of openings which connect the gate metallization to the metal-filled groove, and the source metallization on the dielectric layer and electrically conductive vias in the second group of openings which connect the source metallization to the source region.

9. The method of claim 1, further comprising:
   interrupting the metal-filled groove at least once over a length of the metal-filled groove so that the metal-filled groove comprises at least two different sections spaced apart in the trench.

10. The method of claim 1, further comprising:
    forming an additional trench extending into the substrate adjacent the source and the body regions and spaced apart from the trench with the polysilicon gate electrode;
    forming a polysilicon field plate in the additional trench which is insulated from the substrate; and
    forming an additional metal-filled groove in the polysilicon field plate which is electrically connected to the source metallization.

11. The method of claim 10, wherein the additional metal-filled groove in the polysilicon field plate extends along a length of the additional trench underneath at least part of the gate metallization.

12. The method of claim 1, further comprising:
    forming a polysilicon field plate in the same trench as the polysilicon gate electrode, the polysilicon field plate being insulated from the substrate and the polysilicon gate electrode; and
    forming an additional metal-filled groove in the polysilicon field plate which is electrically connected to the source metallization.

13. The method of claim 12, wherein the additional metal-filled groove in the polysilicon field plate extends along the length of the trench underneath at least part of the gate metallization.

14. The method of claim 1, wherein the gate metallization layer is formed to comprise two spaced apart fingers, wherein the metal-filled groove is formed to be electrically connected to the two spaced apart fingers and extend between the two spaced apart fingers directly underneath at least part of the source metallization, and wherein the metal-filled groove is formed to be insulated from the source metallization by the dielectric layer.

15. The method of claim 1, further comprising:
    reducing a cross-sectional area of the metal-filled groove over part of the length of the metal-filled groove to form a resistor from the part of the metal-filled groove with the reduced cross-sectional area.

16. The method of claim 1, wherein the metal-filled groove extends continuously from a first end of the trench to an opposing second end of the trench, and wherein the metal-filled groove is electrically connected to the gate metallization at the first and the second ends of the trench.

17. The method of claim 1, wherein the groove is filled with at least one of Ti/TiN/W and TiW.

18. The method of claim 1, wherein the semiconductor substrate comprises an epitaxial layer of the second conductivity type, the method further comprising:
    forming a drift region of the second conductivity type in the epitaxial layer,
    wherein the trench extends into the drift region.

19. A semiconductor device, comprising:
a trench extending into a semiconductor substrate;
a polysilicon gate electrode in the trench and which is insulated from the substrate;
a body region of a first conductivity type in the substrate adjacent the trench;
a source region of a second conductivity type opposite the first conductivity type adjacent the body region and the trench;
a dielectric layer on the substrate;
a gate metallization on the dielectric layer which covers part of the substrate;
a source metallization on the dielectric layer and which is electrically connected to the source region, the source metallization being spaced apart from the gate metallization and covering a different part of the substrate than the gate metallization; and
a metal-filled groove in the polysilicon gate electrode which is electrically connected to the gate metallization, the metal-filled groove extending along a length of the trench underneath at least part of the source metallization.

* * * * *